(12) United States Patent
Fung

(10) Patent No.: US 8,853,997 B2
(45) Date of Patent: Oct. 7, 2014

(54) APPARATUS, SYSTEM AND METHOD FOR CHARGING BATTERIES

(75) Inventor: Henry T. Fung, San Jose, CA (US)

(73) Assignee: Superior Electron LLC, Grosse Pointe, MI (US)

( * ) Notice: Subject to any disclaimer, the term of this patent is extended or adjusted under 35 U.S.C. 154(b) by 722 days.

(21) Appl. No.: 12/909,108

(22) Filed: Oct. 21, 2010

(65) Prior Publication Data

US 2012/0019196 A1    Jan. 26, 2012

Related U.S. Application Data

(60) Provisional application No. 61/365,990, filed on Jul. 20, 2010.

(51) Int. Cl.
*H02J 7/00* (2006.01)
*B60L 11/18* (2006.01)

(52) U.S. Cl.
CPC .............. *H02J 7/0013* (2013.01); *Y04S 10/126* (2013.01); *Y02T 10/7088* (2013.01); *Y02T 90/121* (2013.01); *Y02T 90/16* (2013.01); *Y04S 30/14* (2013.01); *B60L 11/1816* (2013.01); *Y02T 90/128* (2013.01); *Y02T 10/7055* (2013.01); *B60L 11/1844* (2013.01); *B60L 2230/16* (2013.01); *B60L 11/184* (2013.01); *B60L 11/1848* (2013.01); *B60L 2240/72* (2013.01); *B60L 11/1842* (2013.01); *Y02E 60/721* (2013.01); *Y02T 10/7005* (2013.01); *Y02T 90/169* (2013.01); *Y02T 90/14* (2013.01); *Y02T 90/163* (2013.01); *B01L 11/1846* (2013.01)
USPC ........... 320/107; 320/104; 320/109; 320/132; 320/134

(58) Field of Classification Search
USPC ......................................................... 320/107
See application file for complete search history.

(56) References Cited

U.S. PATENT DOCUMENTS

| | | |
|---|---|---|
| 5,459,358 A | 10/1995 | Rose |
| 5,548,200 A | 8/1996 | Nor et al. |
| 5,642,270 A | 6/1997 | Green et al. |
| 5,696,436 A | 12/1997 | Kim et al. |
| 5,803,215 A | 9/1998 | Henze et al. |
| 6,285,162 B1 * | 9/2001 | Koo .............................. 320/132 |
| 6,349,883 B1 | 2/2002 | Simmons et al. |
| 7,358,701 B2 | 4/2008 | Field et al. |
| 7,679,336 B2 | 3/2010 | Gale et al. |
| 7,693,609 B2 * | 4/2010 | Kressner et al. .............. 700/291 |
| 2003/0169017 A1 * | 9/2003 | Ariga et al. ................... 320/125 |
| 2009/0062967 A1 * | 3/2009 | Kressner et al. .............. 700/286 |
| 2009/0079388 A1 * | 3/2009 | Reddy ........................... 320/109 |

(Continued)

*Primary Examiner* — Edward Tso
*Assistant Examiner* — Johali Torres Ruiz
(74) *Attorney, Agent, or Firm* — Dykema Gossett PLLC

(57) ABSTRACT

An apparatus, system, and method for charging batteries is provided. The apparatus comprises a monitoring unit configured for coupling to a battery and power source. The monitoring unit configured to acquire a control value indicative of a parameter, and to control the charging of the battery responsive thereto. The system comprises a plurality of battery chargers configured for coupling with respective batteries and a common power source. Each charger configured to obtain information relating to a parameter, to communicate the information to the other chargers, to acquire a control value from the information obtained thereby or received from another charger, and to control the charging of the associated battery based on the acquired control value. The method comprises providing a monitoring unit coupled to a battery and power source, acquiring a control value indicative of a parameter, and controlling the charging of the battery responsive to the control value.

28 Claims, 4 Drawing Sheets

(56) References Cited

U.S. PATENT DOCUMENTS

| | | |
|---|---|---|
| 2009/0115251 A1 | 5/2009 | Nakamura et al. |
| 2009/0200988 A1 | 8/2009 | Bridges et al. |
| 2009/0222143 A1 | 9/2009 | Kempton |
| 2009/0313098 A1 | 12/2009 | Hafner et al. |
| 2009/0315512 A1 | 12/2009 | Ichikawa et al. |
| 2010/0006356 A1 | 1/2010 | Curry et al. |
| 2010/0012406 A1 | 1/2010 | Kressner et al. |
| 2011/0109266 A1* | 5/2011 | Rossi .......................... 320/109 |

* cited by examiner

APPARATUS, SYSTEM AND METHOD FOR CHARGING BATTERIES

CROSS REFERENCE TO RELATED APPLICATIONS

This application claims the benefit of U.S. Provisional Patent Application Ser. No. 61/365,990 filed Jul. 20, 2010 and entitled "Random Time Delayed Battery Charger and Monitoring System," which is incorporated herein by reference in its entirety.

BACKGROUND OF THE INVENTION a. Field of the Invention

This disclosure relates to an apparatus, system, and method for charging batteries. More particularly, this disclosure relates to an apparatus, system, and method for charging batteries used, for example, with electric vehicles.

b. Background Art

As battery-powered electric vehicles are becoming more ubiquitous, the charging or recharging of the batteries of these vehicles can create a strain on the power grid to which the electric vehicles are coupled and that is used to provide the charging current to charge/recharge the batteries of the vehicles. More particularly, the recharging of an electric vehicle requires a relatively large amount of electricity, and therefore, it consequently results in a relatively large energy drain. This is particularly acute at the times when many electric vehicles have to be recharged at the same time, such as, for example, in the evening when most people are at their homes and have "plugged-in" their vehicles for recharging. This is problematic because the power grid used to charge the batteries of the electric vehicles is also used to supply power to many other applications, such as, for example, homes, schools, restaurants, stores, hospitals, street lights, and the like. As more demand is put on the power grid, the less optimal power delivery becomes.

One way in which this issue has been addressed is to provide communication between the power grid and the chargers connected thereto, and coordinating or controlling the operation of the individual chargers by the power grid or a central controller thereof. Accordingly, this arrangement generally includes a central hub that is coupled to the power grid and corresponding chargers. The chargers are configured to communicate to the power grid, and the power grid to the chargers, such that the power grid or the central hub thereof can exert control over when and to which chargers charging current is supplied. In principal, such an arrangement allows for a coordinated, central means by which both the amount of electricity going to the chargers from the power grid and the timing of the provision of charging current may vary depending on the needs of the power grid. The purpose of this type of arrangement is that by allowing the power grid to coordinate and control the charging of the batteries, the power grid will avoid being overloaded and better optimize power delivery by controlling when and how much power to deliver to each battery connected to the grid.

This arrangement is not without its disadvantages, however. For example, the arrangement is not currently supported by the infrastructure, and updating of the infrastructure may be prohibitively expensive and take an exorbitant amount of time to implement.

Accordingly, the inventors herein have recognized a need for an apparatus, system, and method for charging batteries that will minimize and/or eliminate one or more of the deficiencies in conventional systems.

BRIEF SUMMARY OF THE INVENTION

The present invention is directed to an apparatus, system, and method for charging batteries. The apparatus, in accordance with present teachings, comprises a monitoring unit. The monitoring unit is configured to be electrically coupled to a battery and a power source. The monitoring unit is further configured to acquire a control value indicative of a predetermined parameter. The monitoring unit is still further configured to control the charging of the battery responsive to the control value.

In accordance with another aspect of the invention, a battery charging system comprises a first battery charger unit configured to be electrically coupled to a first battery and a power source. The system further comprises a second battery charger unit configured to be electrically coupled to a second battery and the power source. Each of the first and second battery charger units are configured to obtain information relating to the first and second batteries, respectively, the charging of the first and second batteries, respectively, and/or the power source. Each of the first and second battery charger units are further configured to communicate the information obtained thereby to the other of the first and second battery charger units. The first battery charger unit is configured to acquire a control value indicative of a predetermined parameter based on the information obtained by the first battery charger unit and/or the information obtained by the second battery charger unit that is received by the first battery charger unit. The first battery charger unit is further configured to control the charging of the first battery responsive to the control value acquired by the first battery charger unit. Similarly, the second battery charger unit is configured to acquire a control value indicative of a predetermined parameter based on the information obtained by the second battery charger unit and/or the information obtained by the first battery charger unit that is received by the second battery charger unit. The second battery charger unit is further configured to control the charging of the second battery responsive to the control value acquired by the second battery charger unit.

In accordance with still another aspect of the invention, a method of charging a battery comprises the step of providing a battery charger unit that includes a monitoring unit electrically coupled to the battery and a power source. The method further comprises the step of acquiring, by the monitoring unit, a control value indicative of a predetermined parameter. The method still further comprises the step of controlling, by the monitoring unit, the charging of the battery responsive to the control value.

The foregoing and other aspects, features, details, utilities, and advantages of the present invention will be apparent from reading the following description and claims, and from reviewing the accompanying drawings.

DETAILED DESCRIPTION OF EMBODIMENTS OF THE INVENTION

Figure 1:
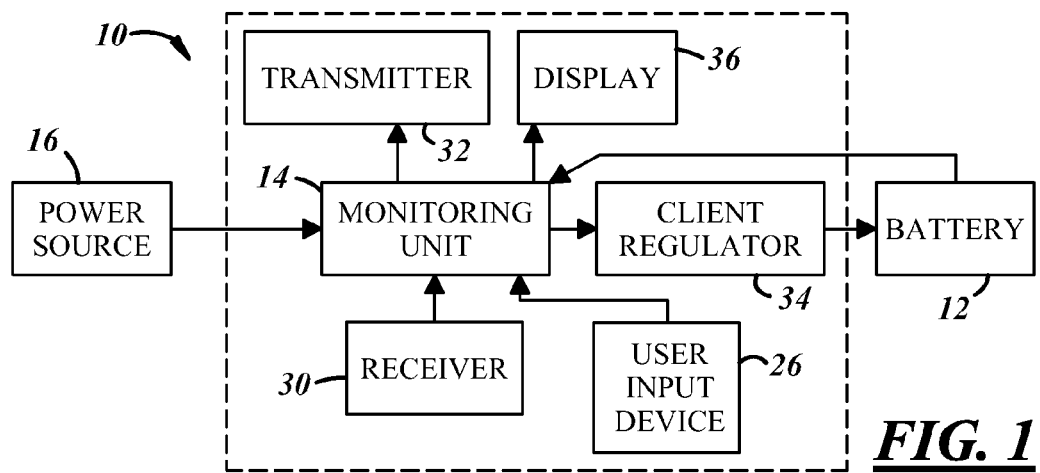
FIG. 1 is a diagrammatic and schematic view of an exemplary embodiment of a battery charger unit in accordance with the present teachings.

Referring now to the drawings wherein like reference numerals are used to identify identical components in the various views, FIG. 1 illustrates one exemplary embodiment of a battery charger unit 10 for charging a battery 12, such as, for example and without limitation, lithium ion batteries used in electric vehicle applications. In an exemplary embodiment, the charger unit 10 comprises a monitoring unit 14. The monitoring unit 14 is configured to be electrically coupled to the battery 12 when the battery 12 is coupled with the charger unit 10. The monitoring unit 14 is further configured to be electrically coupled with a power source 16 that is used to provide charging current to the battery 12. The power source 16 may be, for example, a power grid accessed through an electrical receptacle (located in, for example, a garage of a house) by plugging the charger unit 10 into the electrical receptacle. The charger unit 10 may be a stand alone device configured to be coupled to a battery, or alternatively, may be installed within, for example, an electric vehicle. In the latter instance, the charger unit 10 may be selectively electrically coupled to the battery 12 and the power source 16 (e.g., the battery may be selectively connected and disconnected from the charger unit 10 and the charger unit 10 may be selectively connected to the power source 16—i.e., "plugged" and "unplugged"), or may be constantly coupled to the battery 12 and have a plurality of operating modes (e.g., charging mode, monitoring mode, OFF mode, etc.) to control the operation of the charger unit 10 when the charger unit 10 is electrically coupled to the power source. Similarly, in the embodiment wherein the charger unit 10 is a stand alone device, it may also have a plurality of operating modes such as those identified above.

In an exemplary embodiment, and in general terms, the monitoring unit 14 is configured to acquire one or more control values indicative of one or more predetermined parameters, and to then control the charging of the battery 12 in response to the control value(s) corresponding to the parameter(s). As will be described in greater detail below, based on the control value(s), the monitoring unit 14 is configured to determine, for example and without limitation, when to charge the battery 12 (i.e., when to supply charging current from the power source 16 to the battery 12) and/or how much charging current to supply to the battery 12 from the power source 16.

The predetermined parameter(s) may comprise any number of parameters relating to, for example, the battery 12 and/or the power source 16. Parameters that may be used include, for example and without limitation, the remaining charge level of the battery 12 (e.g., a percentage value representing the percentage of the maximum charge level remaining in the battery 12 or the actual magnitude of the remaining charge (i.e., in kWh)), the size of the battery 12, and the voltage level of the power source 16. It will be appreciated that while these parameters are identified with specificity, other parameters relating to the battery 12, the power source 16, or, as will be described in greater detail below, parameters other than those relating to the battery 12 or the power source 16, may be used (such as, for example, a random number generated by the monitoring unit 14, the number of batteries being charged using the power source 16, etc.). Accordingly, the specific parameters identified above are provided for exemplary purposes only and are not meant to be limiting in nature.

The monitoring unit 14 may comprise a number of components. In one exemplary embodiment illustrated, for example, in FIG. 2, the monitoring unit 14 comprises a processor 18, a memory or storage device 20, a battery level sensor 22, and a line voltage level sensor 24. Some or all of these components may be separate and distinct from each other and electrically coupled and configured for communication therebetween, as appropriate. In an embodiment wherein the battery level sensor 22 and/or the line voltage sensor 24 are separate and distinct from the monitoring unit 14, the battery charger unit 10 may further include one or more analog-to-digital converters electrically coupled between the sensor(s) 22, 24 and the monitoring unit 14. Alternatively, the components of the monitoring unit 14 described above may comprise a single unit, such as, for example, a system-on-a-chip. The following description applies with equal force to either arrangement.

The processor 18 is configured to acquire the control value(s) indicative of the predetermined parameter(s), and to then control the charging of the battery 12 responsive thereto. The control values may comprise an actual value of the parameter (i.e., the actual voltage level of the power source, the actual remaining charge of the battery, etc.), or a scaled or correlated value of the actual values of the parameters (i.e., rather than the actual values, the values of the parameter may be assigned or equated with a scaled or correlated value to be used in the control of the charging of the battery). Accordingly, in either instance, the processor 18 is configured to obtain information relating one or more parameters, which may comprise the actual value(s) of the parameter(s), and to then acquire the control value(s) for the relevant parameter(s) based on the obtained information. In an embodiment wherein a control value corresponds to the actual value of the corresponding parameter, the processor 18 is configured to process the information and assign the actual value as the control value for that parameter. Alternatively, in an embodiment wherein a control value corresponding to a parameter is a correlated/scaled value of the actual value, the processor 18 is configured to process the actual value, acquire a correlated/scaled value corresponding to the actual value, and assign the correlated/scaled value as the control value for that parameter.

Figure 2:
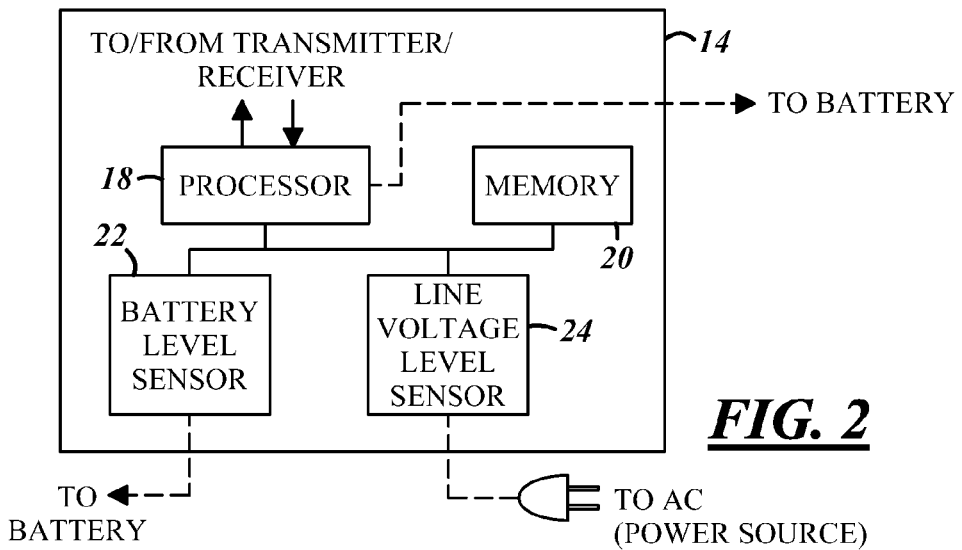
FIG. 2 is a diagrammatic and schematic view of an exemplary embodiment of a monitoring unit of the battery charger unit illustrated in FIG. 1 in accordance with the present teachings.

The information relating to the relevant parameters may be obtained by the processor 18 from a number of sources. For example, if the parameter (or one of the parameters) being used is the remaining charge level of the battery 12, the processor 18 may acquire the actual value of the remaining charge of the battery 12 from the battery level sensor 22 (e.g., the percentage of the maximum charge level that remains in the battery 12). Accordingly, in such an embodiment, and as illustrated in FIG. 2, the battery level sensor 22 is electrically coupled to the battery 12 and the processor 18, and is configured to sense the remaining charge level of the battery 12. The sensed charge level is then communicated to the processor 18, or to the memory or storage device 20 thereof or accessible thereby where it may be accessed by the processor 18 at a later time. As will be described in greater detail below, the processor 18 is configured to process the actual value of the remaining charge level in order to acquire a corresponding control value indicative of the parameter, which as described above, may be the actual value itself or a scaled or correlated value corresponding to the actual value. Once the control value is acquired by the processor 18, the processor 18 may use it in the control of the charging of the battery 12.

In an embodiment wherein the voltage level of the power source 16 is used, the processor 18 may acquire the actual value of the voltage level of the power source 16 from the line voltage level sensor 24. Accordingly, in such an embodiment, and as illustrated in FIG. 2, the line voltage level sensor 24 is electrically coupled to the power source 16 and is configured to sense the voltage level of the power source 16. This sensed voltage level is then communicated to the processor 18, or to the memory or storage device 20 thereof or accessible thereby where it may be accessed by the processor 18 at a later time. As will be described in greater detail below, the processor 18 is configured to process the actual value of the voltage level in order to acquire a corresponding control value indicative of the parameter, which, as described above, may be the actual value itself or a scaled or correlated value corresponding to the actual value. Once the control value is acquired by the processor 18, the processor 18 may use it in the control of the charging of the battery 12.

In another exemplary embodiment, instead of, or in addition to, the parameters described above, the parameter of the size of the battery 12 may be used. In such an instance, the actual value of this parameter may be pre-programmed into the processor 18 (or the memory or storage device 20 thereof or accessible thereby). Alternatively, the actual value may be entered by a user using, for example, a user input device 26 (as shown in FIG. 1) that is part of, or electrically coupled to, the monitoring unit 14. In such an instance, the user input device 26 is electrically coupled to the processor 18 and may comprise any number of devices known in the art, such as, for example and without limitation, a touch screen, a computer mouse, a keyboard, a keypad, a slider control, or some other user-controllable input device known in the art that is electrically connected to the processor 18. As with the parameters described above, in this embodiment, the processor 18 is configured to process the actual value of the battery size in order to acquire a corresponding control value indicative of the parameter, which may be the actual value itself or a scaled or correlated value corresponding to the actual value. Once the control value is acquired by the processor 18, the processor 18 may use it in the control of the charging of the battery 12.

In yet another exemplary embodiment, a parameter that may be used is a random number generated by, for example, the processor 18. The random number ensures that if there are other batteries requiring charging (as will be described below), and the other parameters being considered are the same for each battery, the charging will be differentiated because it is highly unlikely two or more charger units 10 would generate the same random number. As with the parameters described above, in this embodiment the processor 18 is configured to process the actual value of the random number in order to acquire a corresponding control value indicative of the parameter, which may be the actual value itself or a scaled or correlated value corresponding to the actual value. Once the control value is acquired by the processor 18, the processor 18 may use it in the control of the charging of the battery 12.

In yet still another embodiment, parameters that may be used may be parameters corresponding to batteries and battery charger units other than the battery 12 being charged by the battery charger unit 10. Accordingly, in such an embodiment, the monitoring unit 14 is configured to receive information relating to parameters of other batteries and charger units. In an exemplary embodiment, the charger unit 10 includes a receiver 30. The receiver 30 is electrically coupled to the monitoring unit 14, and the processor 18 thereof, in particular, and is operative to receive electrical signals generated by another monitoring unit 14 of another battery charger unit 10. The electrical signals are representative of, for example, information relating to parameters such as the actual values of the parameters described above corresponding to the other battery charger unit and the battery associated therewith, the control values corresponding to those parameters, time delay ($t_s$) and charging current (I) determinations for the other battery charger unit 10 (both of which will be described in greater detail below), and other information relating to, for example, the power source with which the other battery charger unit is coupled (e.g., the power source 16), the battery associated with the other battery charger unit, and the charging of that battery. In such an embodiment, the monitoring unit 14 may be configured to use the information relating to the parameters transmitted by the other battery charger unit and received by the receiver 30 in the charging of the battery 12, as will be described below.

Accordingly, in an exemplary embodiment, the processor 18 is configured to receive the electrical signals representative of information relating to, for example, parameters of another battery, the charging of that other battery, and/or the power source to which the other battery is coupled, which would typically be the same power source to which the battery 12 is coupled, and therefore, the power source 16. The processor 18 is further configured to process the information to acquire a control value (either the actual value or a scaled/correlated value) corresponding to one or more parameters to which the received information relates.

In an exemplary embodiment, in addition to the receiver 30, the charger unit 10 further includes a transmitter 32. The transmitter 32 is electrically coupled to the monitoring unit 14, and the processor 18 thereof, in particular, and is operative to transmit electrical signals generated by the processor 18. The electrical signals are representative of, for example, information relating to parameters such as the actual values of the parameters described above, the control values corresponding to the parameters described above, the time delay ($t_s$) and the charging current (I) determinations for the battery 12 and battery control unit 10 (which will be described in greater detail below), and other information relating to the power source 16, the battery 12, and the charging of the battery 12.

It will be appreciated by those having ordinary skill in the art that in an embodiment wherein the charger unit 10 includes a transmitter and a receiver, the two may be combined as a transceiver and may comprise a single component. Alternatively, the transmitter and receiver may be separate and distinct components. Additionally, in an exemplary embodiment, the monitoring unit 14, the receiver 30, and transmitter 32 may be configured or arranged so as to comprises a system-on-a-chip. Alternatively, the components may be separate and distinct from each other and configured for communication therebetween, as appropriate.

Regardless of the parameter or parameters used by the monitoring unit 14, the monitoring unit 14, and the processor 18 thereof, in particular, is configured to use control values indicative of one or more parameters to control the charging of the battery 12. More particularly, the processor 18 is configured to use the control value(s) of one or more predetermined parameter(s) to determine, for example, when to charge the battery 12 (e.g., determine a time delay ($t_s$) from the time at which the determination is made at the end of which charging will commence) and/or how much charging current to supply to the battery 12 from the power source 16 to charge the battery 12.

Figure 4:
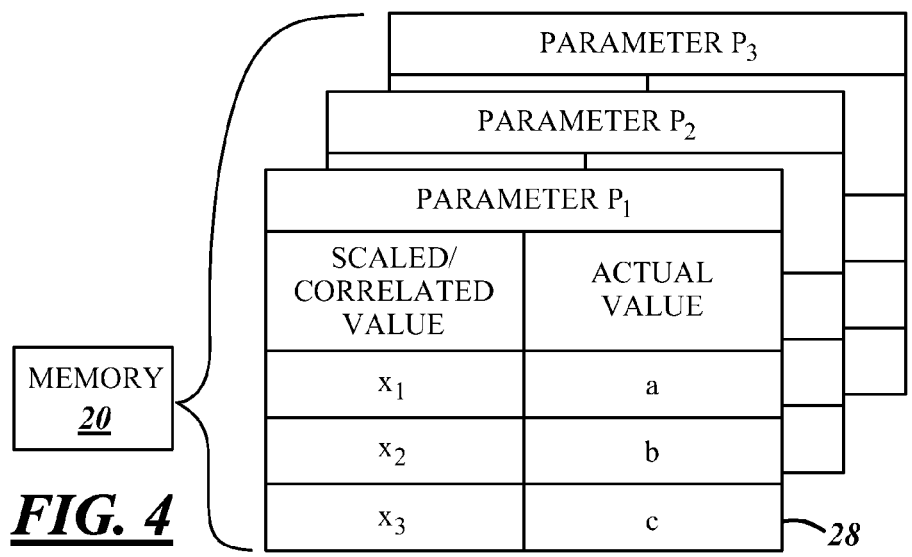
FIG. 4 is a diagrammatic view of an exemplary data structure of a memory or storage device of the battery charger unit illustrated in FIG. 1.
Figure 3:
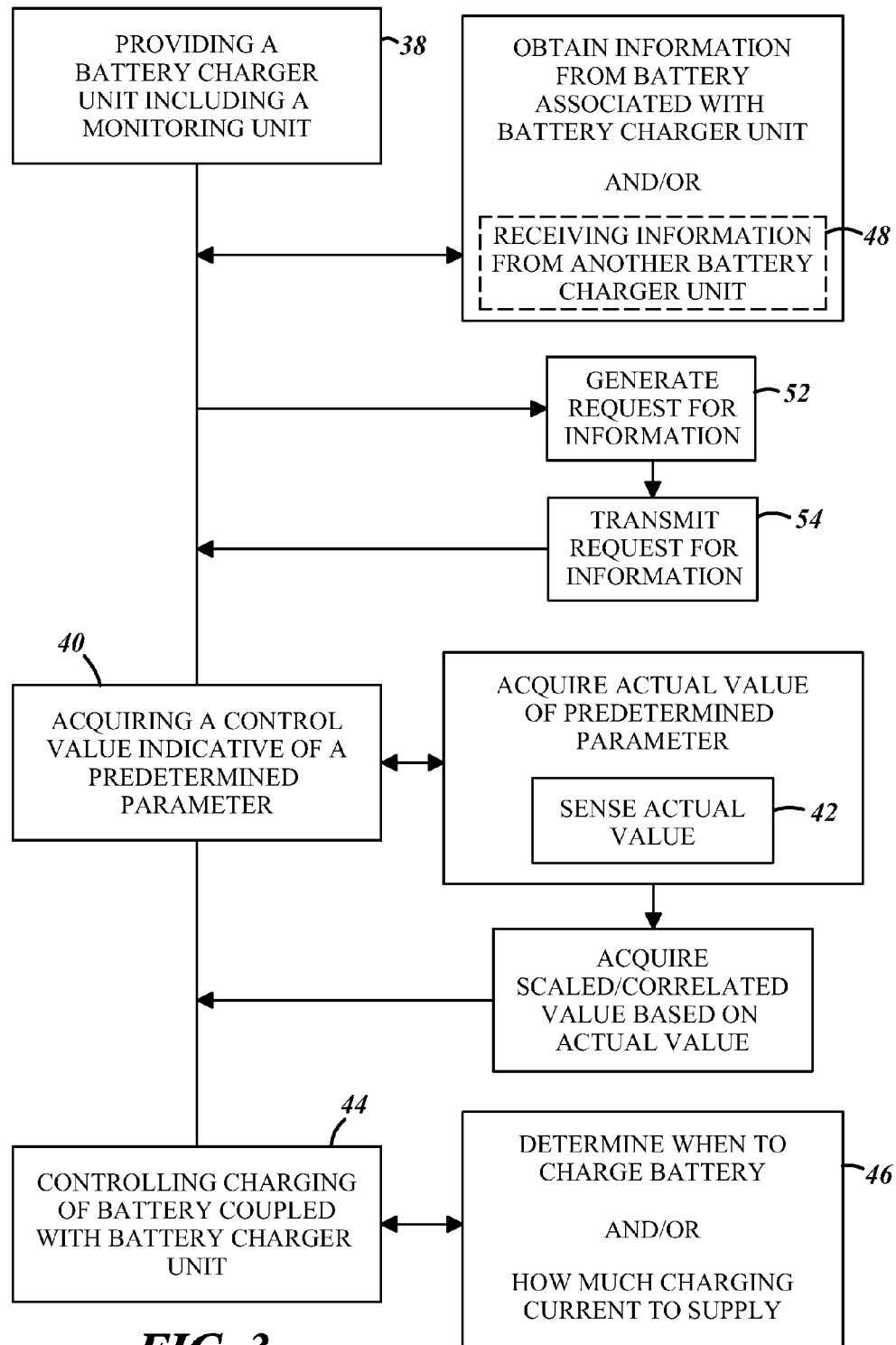
FIG. 3 is a flow diagram of an exemplary embodiment of a method for charging a battery in accordance with the present teachings.

With reference to FIGS. 3 and 4, an exemplary technique of determining when to charge, and/or how much charging current to supply to the battery 12, will now be described. It will be appreciated that while the following technique is the only technique being described in detail, it is being provided for exemplary purposes only and is not meant to be limiting in nature. Accordingly, one of ordinary skill in the art will appreciate that other techniques of using the control value(s) indicative of predetermined parameter(s) to control the charging of the battery 12 may be used, and therefore, remain within the spirit and scope of the present invention.

With reference to FIG. 3, the processor 18 is configured to obtain information relating to one or more predetermined parameters, and to then acquire one or more control values indicative of the predetermined parameters. For the sake of simplicity of explanation, the following description will be limited to an embodiment wherein the processor 18 uses a single control value of a single predetermined parameter to control the charging of the battery 12, and further wherein the control value is a scaled or correlated value of the actual value of the parameter being used (as opposed to the actual value being the control value). Accordingly, the processor 18 is configured to obtain an actual value for the predetermined parameter (e.g., the remaining charge of the battery 12, the size of the battery 12, the voltage level of the power source, etc.). In an exemplary embodiment, the processor 18 is configured to store the value in the memory or storage device 20 (e.g., in a table stored in the memory 20) that is either part of or accessible by the processor 18.

Figure 8:
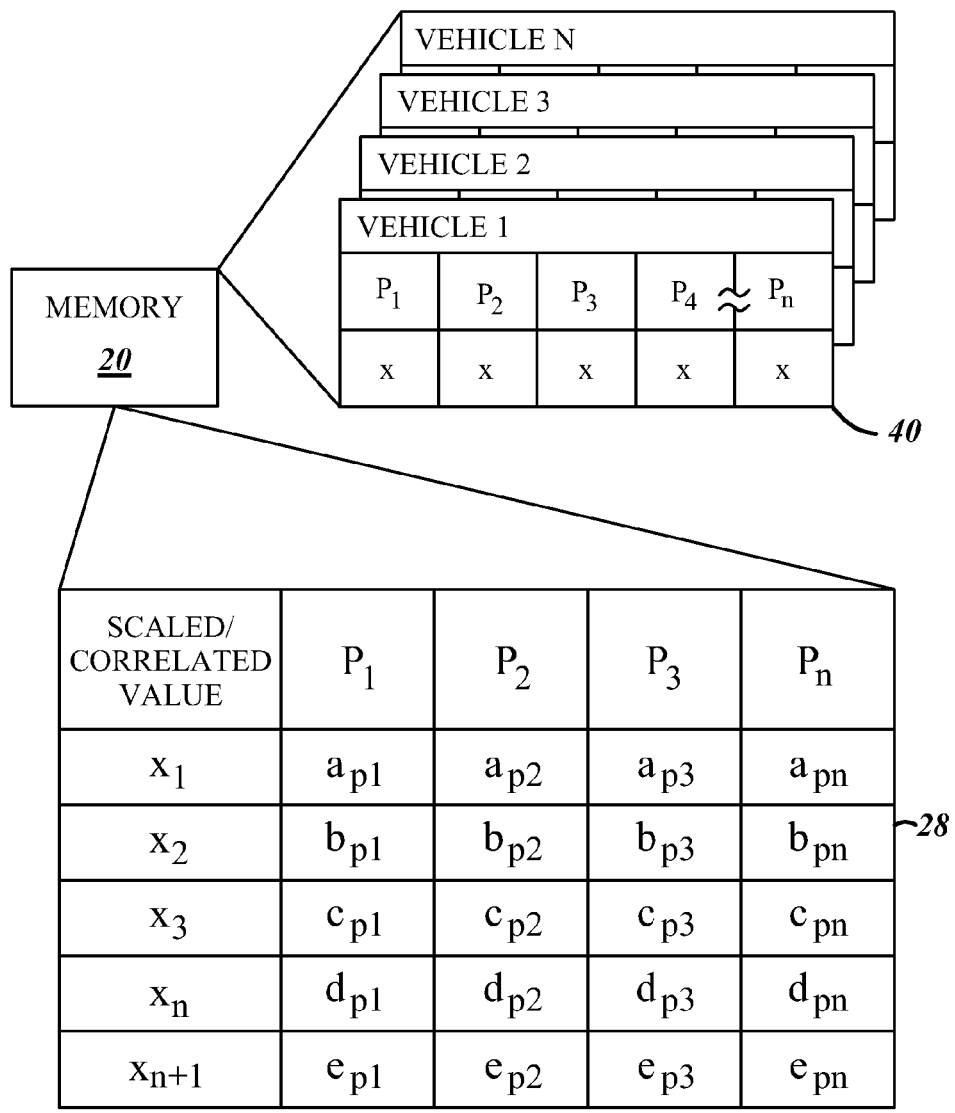
FIG. 8 is another diagrammatic view of an exemplary data structure of a memory or storage device of the battery charger unit illustrated in FIG. 1.

Once the processor 18 obtains the actual value of the predetermined parameter, the processor 18 is configured to correlate it with a corresponding scaled/correlated value. Once the scaled/correlated value is obtained, it is assigned as the control value for the parameter, thereby resulting in the processor 18 acquiring a control value that is indicative of the parameter. In an exemplary embodiment, this is done by looking up the actual value of the parameter in a look-up table stored in, for example, the memory 20, such as look-up table 28 illustrated in FIG. 4. The look-up table 28 may be a dedicated look-up table for the parameter being used such that each parameter has its own look-up table (as is illustrated in FIG. 4), or may be a master look-up table comprising a plurality of parameters (as is illustrated in FIG. 8). The look-up table 28 may comprise actual values for the parameters, or may comprise ranges of values. For example, in the look-up table 28 illustrated in FIG. 4, the actual values "a," "b," and "c" may be single values (e.g., 108 V, 30% remaining charge of the battery, etc.) or may represent ranges, such as, for example, 105-108 V (or 105 V<y<108 V), or 15-30% remaining charge (15%<y<30%). In either instance, the processor 18 is configured to process the actual value by locating it in the table 28 and then acquiring the corresponding scaled/correlated value, which, in this embodiment, is also the control value.

With continued reference to FIG. 3, once the control value indicative of the predetermined parameter is acquired by the monitoring unit 14, and the processor 18 thereof, in particular, the processor 18 is configured to control the charging of the battery 12. In an exemplary embodiment, this entails determining when to charge the battery 12 and/or how much charge current to supply to the battery 12 from the power source 16 responsive to the control value. Each of these two determinations will be described in turn.

With respect to determining when to charge the battery 12, in an exemplary embodiment, the processor 18 is configured to use the control value to calculate a time delay ($t_s$). The time delay represents the amount of time that must elapse from the calculation of the time delay (or another predetermined point in time) before the charging of the battery 12 will commence. Accordingly, if the time delay is 45 minutes (i.e., $t_s$=45), then the battery will charge 45 minutes from the point in time at which the determination is made. Thus, if the battery 12 is coupled to the charger unit 10 at 6:00 pm, and the charger makes the determination at 6:00 pm, the charger unit 10 will commence the charging of the battery 12 at 6:45 pm.

The time delay may be calculated in any number of ways. In one exemplary embodiment, the processor 18 is configured to process the control values with the number of parameters being used and a normalizing constant. Equation (1) is an exemplary equation that may be used to calculate the time delay, wherein the terms "$x_1$", "$x_2$", and "$x_n$" are control values corresponding to and indicative of the respective parameters, the term "n" is the number of parameters being used, and the term "C" is a normalizing constant:

$$t_s = \frac{x_1 + x_2 + \ldots + x_n}{n} \times C \tag{1}$$

To demonstrate how this calculation may be made, assume that there are three parameters being used (n=3), and therefore, there are three control values ($x_1$, $x_2$, $x_3$),—one for each parameter. In this example, the following control values are assigned: $x_1$=1.0; $x_2$=0.8; and $x_3$=0.9, and the calculation is normalized to six hours, therefore, C=6. Accordingly, to determine the time delay for the battery 12 in this example, the processor 18 would execute equation (2):

$$t_s = \frac{1.0 + 0.8 + 0.9}{3} \times 6 \tag{2}$$

When equation (2) is executed, the time delay for the battery 12 in this example is 5.4 minutes. Therefore, the charging of the battery 12 will commence after 5.4 minutes has elapsed.

In addition to the above, rather than using the control values indicative of the parameters being used alone, some or all of the parameters may be weighted to cause some of the parameters to have a greater impact or optimization on the charging determinations than others. Accordingly, in an exemplary embodiment, equation (1) above may be augmented as set forth in equation (3) below to provide for the weighting of the control values of the parameters.

$$t_s = \frac{w_1 x_1 + w_2 x_2 + \ldots + w_n x_n}{n} \times C \tag{3}$$

In such an embodiment, the processor 18 may be programmed with weights to be applied to the control values or, alternatively, the processor 18 may be configured to receive input signals from a user input device, such as the user input device 26, such that the user of the charger unit 10 may be able to control the weights applied to the control values, and therefore, the optimization of the charging process. Further, the normalizing constant, C, may be fixed or adjustable using, for example, the user input device 26. More particularly, in this embodiment, the normalizing constant correlates to a period of time in which the battery will be charged. Accordingly, if there is a six hour window within which the battery may be charged, the constant will be C=6. However, if the user of the battery wants, for example, a three hour window within which to charge the battery, he may adjust the default or current value of the constant (e.g., change the value of C to C=3) such that the constant will be changed to meet the users requirements. Therefore, there is some measure of control the user may exert over the charging process.

One advantage of determining when to charge the battery 12 using the intelligence above, as opposed to automatically charging the battery 12 as soon as it is coupled with the charger unit 10, for example, is that the demand on the power source 16 in peak power delivery times may be reduced and the battery may be charged at a more opportune time so as to not overload the power source 16.

In addition to, or instead of, determining when to charge the battery 12, the monitoring unit 14, and the processor 18 thereof, in particular, may determine how much charging current to supply to the battery 12 from the power source 16.

The magnitude of charging current may be calculated in any number of ways. In one exemplary embodiment, the processor 18 is configured to process the control value(s) with the number of parameters being used and a normalizing term such as, for example, the rated charge current ($I_c$) for the battery 12. The rated charge current is dependent upon the size of the battery as well as the length of the time period within which the user wants the battery 12 to charge. For example, if the user wants to charge the battery 12 for a three (3) hour time period, the rated charge current will be higher than if the user wants to charge the battery for a six (6) hour time period. Equation (4) is an exemplary equation that may be used to calculate the charge current, wherein the terms "$x_1$", "$x_2$", and "$x_n$" are control values corresponding to and indicative of respective parameters, the term "n" is the number of parameters being used, and the term "$I_c$" is the rated charge current of the particular battery being charged:

$$I = \frac{x_1 + x_2 + \ldots + x_n}{n} \times I_c \quad (4)$$

To demonstrate how this calculation may be made, assume that there are three parameters being used (n=3), and therefore, there are three control values ($x_1$, $x_2$, $x_3$)—one for each parameter. For purposes of example only, the following control values are assigned: $x_1$=1.0; $x_2$=0.8; and $x_3$=0.9. Further, assume the rated charge current for the battery being charged is $I_c$=40 amps. Accordingly, to determine the magnitude of the charging current to be supplied to the battery 12, the processor 18 would execute equation (5):

$$I = \frac{1.0 + 0.8 + 0.9}{3} \times 40 \quad (5)$$

When equation (5) is executed, the charging current to be supplied to the battery 12 from the power source 16 is 36 amps.

In addition to the above, rather than using the control value(s) indicative of the parameters being used alone, some or all of the parameters may be weighted to cause some of the parameters to have a greater impact or optimization on the charging determinations than others. Accordingly, in an exemplary embodiment, equation (4) above may be augmented as set forth in equation (6) below to provide for the weighting of the control values of the parameters.

$$I = \frac{w_1 x_1 + w_2 x_2 + \ldots + w_n x_n}{n} \times I_c \quad (6)$$

In such an embodiment, the processor 18 may be programmed with weights to be applied to the control values or, alternatively, the processor 18 may be configured to receive input signals from a user input device, such as the user input device 26, such that the user of the charger unit 10 may be able to control the weights applied to the control values, and therefore, the optimization of the charging process.

Further, the rated charge current, $I_c$, may be fixed or adjustable using, for example, the user input device 26. More particularly, depending on the battery being charged, or the time period in which a user wants to charge the battery, the rated charge current may need to be adjusted.

In an embodiment wherein the rated charge current is fixed and non-adjustable, the charger unit 10 may be configured to charge only a particular type or types of batteries. In another embodiment, however, wherein the magnitude of the rated charge current is adjustable, the charger unit 10 is more flexible in that it can be used with batteries of having different rated charge currents. In such an embodiment, the user input device 26 may be used to adjust the value of the rated charge current. Thus, the processor 18 may be configured to receive input signals generated by the input device 26 that are used to adjust the value of $I_c$. Alternatively, in an exemplary embodiment, the processor 18 may be configured to receive input signals from the user input device 26 relating to the amount of time the battery can be charged (e.g., charge the battery for 1 hour, 3 hours, 6 hours, etc.). The processor 18 may then determine an appropriate value for $I_c$ responsive to the user input and/or the size of the battery 12 (which may be known by the processor 18 or entered using the input device 26). In such an instance, the processor 18 may be configured to look-up the desired charging time and/or size of the battery 12 in a table stored in, for example, the memory 20, to obtain the appropriate $I_c$ value. Therefore, as with the timing determination described above, there is some measure of control the user may exert over the charging process.

One advantage of determining how much charging current to supply to the battery using the intelligence above, as opposed to providing the full amount of available charging current, is that only as much current as is needed is supplied, thereby reducing the demand on the power source 16 during peak power delivery times and avoiding power source overloading.

In an exemplary embodiment, rather than determining only one of when to charge the battery 12 and how much charging current to supply to the battery 12, the monitoring system 14, and the processor 18 thereof, in particular, is configured to determine both when to charge the battery 12 and how much charging current to supply when the charging commences. In such an embodiment, the time delay ($t_s$) and the charging current (I) would be calculated in the same manner described above, and would be represented by equation (7):

$$I(t - t_s) = \frac{x_1 + x_2 + \ldots + x_n}{n} \times I_c \quad (7)$$

Accordingly, the charger unit 10 will supply the charging current calculated using this equation when $I(t-t_s)$ is $I(0)$, or when t, which is a variable value corresponding to the current elapsed time, equals the value of $t_s$.

Once the timing of the charging and/or the amount of charging current that is to be supplied to the battery 12 is determined, the processor 18 is configured to control the charging of the battery 12 in accordance with the determination(s). Accordingly, the processor 18 either allows charging current to be supplied to the battery 12 from the power source 16, or not; and/or regulates the amount of charging current being supplied to the battery 12. In an exemplary embodiment, the charger unit 10 includes a current regulator 34 that is configured to regulate the charging current supplied to the battery 12 from the power source 16 in accordance with the determinations made by the processor 18. Accordingly, the current regulator 34 is disposed between, and electrically coupled to, the power source 16 and the battery 12, and is further electrically coupled with, and controlled by, the processor 18. The current regulator 34 may be part of the monitoring unit 14, or may be a separate and distinct component from the monitoring unit 14. In an exemplary embodiment, the current regulator 34 and the components described above are arranged to form a system-on-a-chip.

With reference to FIG. 1, in addition to the components described above, in an exemplary embodiment the charger unit 10 further includes a display device 36. The display device 36 may be configured to display information for the user relating to the operation of the charging unit 10, the battery 12, and/or the charging thereof, as well as to help facilitate the entering of instructions via the user input device 26. More particularly, the display device 36 may be configured to display the actual values of one or more parameters, such as, for example and without limitation, the remaining charge or size of the battery 12 and the voltage level of the power source 16, as well as determinations made by the monitoring unit 14, such as, for example and without limitation, the calculated time delay ($t_s$) and the magnitude of the calculated charging current (I). Additionally, the display device 36 may display the current values for the normalizing constant (C), the weights assigned to the parameters ($w_1$, $w_2$, ..., $w_n$), and the rated charge current ($I_c$) of the battery 12. The display 36 may also be configured to display selectable menus generated by the processor 18 that allow the user, using the user input device 26 in conjunction with the display 36, to make selections or enter values for different adjustable terms such as those described above. In an exemplary embodiment, the display device 36 is responsive to instructions from the processor 18 (or a video controller thereof, for example) such that the processor 18 controls the content and operation of the display device 36. The display device 36 may take any number of forms that are well known in the art, such as, for example and without limitation, an LCD or CRT monitor, or any other display device known in the art.

It will be appreciated that in addition to the structure of the system 10 described above, another aspect of the present invention is a method for charging a battery 12 using, for example and without limitation, the structure described above. With reference to FIG. 3, and in addition to the description above, the method comprises a step 38 of providing a battery charger unit 10 that includes a monitoring unit 14 electrically coupled to the battery 12 and a power source 16.

The method further comprises a step 40 of acquiring, by the monitoring unit 14, one or more control values indicative of one or more predetermined parameters. As described above, the predetermined parameters may comprise one or more of any number of parameters, such as, for example, parameters relating to the battery 12 itself, the power source 16, parameters of another battery or relating to the charging of another battery, to name a few. In an exemplary embodiment, the acquiring step 40 comprises obtaining information relating to one or more parameters, and then acquiring the control value based on that information. This may include, for example, acquiring an actual value(s) for the relevant parameter(s) or a scaled/correlated value corresponding thereto from the memory 20 of the monitoring unit 14 (or accessible thereby), or the monitoring unit 14 determining the control value in substantially real-time.

For example, in an exemplary embodiment wherein the predetermined parameters comprise one or both of a remaining charge level of the battery 12 and the voltage level of the power source 16, the method further comprises a step 42 of sensing one or both of the remaining charge level and voltage level, and therefore, acquire a control value indicative of one or both parameters.

In an exemplary embodiment, the method still further comprises a step 44 of controlling, by the monitoring unit 14, the charging of the battery 12 in response to the control value(s). In an exemplary embodiment, the method still further comprises a step 46 of determining, by the monitoring unit 14, when to charge the battery 12 and/or how much charging current to supply to the battery 12 from the power source 16 in response to the control value(s) acquired in step 40. The controlling step 44 may then be performed using the determination(s) made in the determining step 46.

In an exemplary embodiment, the method further includes a step 48 of receiving, by the monitoring unit 14, electrical signals generated by another monitoring unit 14 (e.g., monitoring unit 14') associated with another battery 12 (e.g., battery 12'). The electrical signals may be received by a receiver 30 associated with the charger unit 10 and electrically coupled with the monitoring unit 14, or may be received by the monitoring unit 14 directly from the other monitoring unit 14' that is electrically coupled to, and/or configured for communication with, the receiving monitoring unit 14. The electrical signals may be representative of information relating to one or more parameters of the battery 12', the charging of the battery 12', and the power source 16. The received information may comprise one or more control values that may be used by the receiving monitoring unit 14 in the control of the battery 12 associated therewith. Alternatively, the received information may comprise, for example, values of parameters (e.g., actual values of the parameters or scaled/correlated values corresponding thereto) that may be used by the receiving monitoring unit 14 to acquire one or more control values to be used in the charging control process. Accordingly, the received values may be control values or may be used in the determination or acquisition of one or more control values. In an exemplary embodiment, the information received is stored in, for example, a database 50 stored in the memory 20 (see, for example, FIG. 8). Alternatively, the monitoring unit 14 may utilize the received information in substantially real-time and not store the information.

With continued reference to FIG. 3, in an exemplary embodiment wherein, as will be described below, information from other batteries and battery chargers in a network to which the battery charger unit 10 is coupled is used or desired, the method still further comprises a step 52 of generating, by the monitoring unit 14, a request to other monitoring units with which the monitoring unit 14 is configured to communicate for that or those monitoring units to send information relating to the batteries associated therewith, the charging of those batteries and/or the power source 16 to which they are electrically coupled, to the monitoring unit 14. In a related step 54, the method further comprises transmitting the request.

While the description above has been primarily directed to a single charger unit 10 and the constituent components and operation thereof, in an exemplary embodiment, the charger unit 10 may be used in a larger system comprising a plurality of charger units 10 that use a common power source for charging batteries associated therewith, and that are configured for communication therebetween, so as to form a battery charger system 56.

Figure 5:
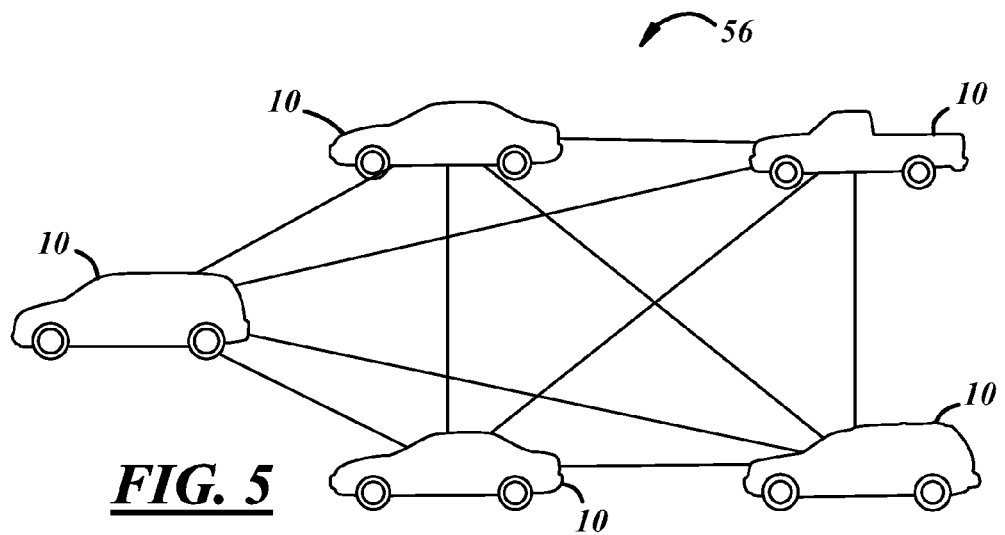
FIG. 5 is a diagrammatic and schematic view of an exemplary embodiment of a battery charging system in accordance with the present teachings.

With reference to FIG. 5, a diagrammatic illustration of such a system 56 is illustrated. In such a system, each battery charger unit 10 is similarly constructed and is configured to operate in the same or substantially similar way, which is described in greater detail above. As such, a detailed description of the composition and operation of the individual battery charger units 10 of the system 56 will not be repeated here. However, generally speaking, each battery charger unit 10 in the system 56 is configured to be electrically coupled to a respective battery 12 and a common power source 16, and to control the charging of the battery associated therewith. Each battery charger unit 10 is further configured to obtain information relating to one or more parameters such as those identified above that correspond to, for example, the battery associated therewith, the charging of the battery associated therewith, the power source 16 to which the battery charger unit is coupled, and the like. The obtained information may comprise, for example, actual values of the parameter(s), scaled/correlated value(s) corresponding to the actual value(s), and/or control value(s) indicative of the parameter that are determined by the battery charger unit 10.

Figure 6:
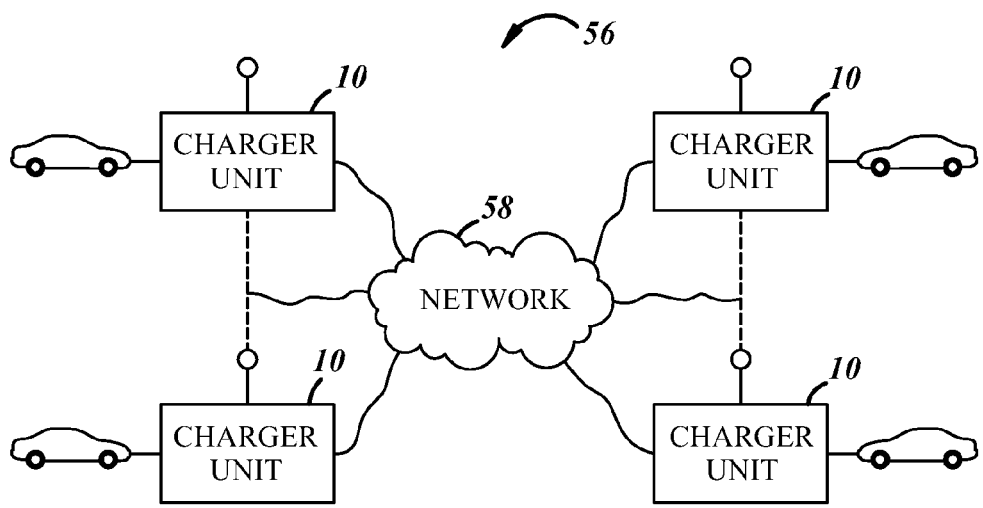
FIG. 6 is another diagrammatic and schematic view of an exemplary embodiment of a battery charging system in accordance with the present teachings.

Each charger unit 10 is further configured to communicate the information obtained thereby to the one or more other battery charger units 10 in the system 56 (using, for example, the transmitters 32 and receivers 30 of the charger units 10). This communication may be carried out in a number of known ways over both wires and wirelessly, and using any number of communication techniques/protocols that are well known in the art. For example, the charger units 10 may communicate using cellular or radio technologies, over the internet, over fiber optic cables, and the like. In an exemplary embodiment illustrated, for example, in FIG. 6, the charger units 10 are coupled together and configured for communication via a communication network 58, such as, for example, a peer-to-peer network, the operation and configuration of which is well known in the art, and therefore, will not be described here.

The communication between chargers may be initiated in a number of ways. For example, whenever the battery 12 is coupled with the charger unit 10, and the monitoring unit 14 thereof, in particular, the appropriate information may be automatically obtained and transmitted or broadcast to the other charger units 10 in the network along with an appropriate identifier to allow the other charger units 10 to identify the charger unit from which the information was sent. In addition, or alternatively, the information may be transmitted when the charger unit 10 is in a mode of operation in which the charger unit 10 is configured to transmit information, such as, for example, a charging mode or a monitoring mode. Still further, the information may be repeatedly obtained and/or transmitted at a predetermined time interval so that updated information may be transmitted, and/or new charger units that have come onto the network since the initial transmission can receive the information. Alternatively, or in addition, rather than unilaterally transmitting information, a charger unit 10 may transmit the information upon receiving a request or inquiry to do so by another charger unit 10 in the network (i.e., one charger polls the other chargers for their information). Accordingly, one of ordinary skill in the art will appreciate that the transmission of information between charger units 10 may be initiated or occur in a number of known ways.

Figure 7:
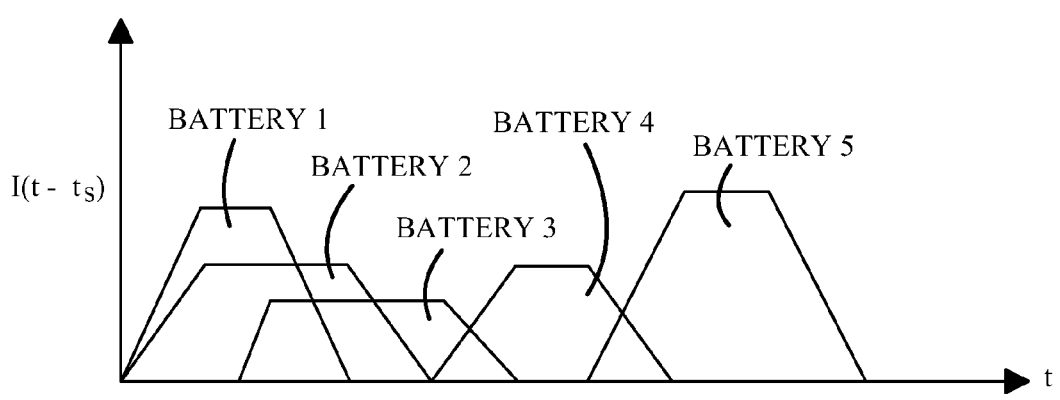
FIG. 7 is a battery charging graph illustrating the charging of multiple batteries in accordance with the present teachings.

Because the charger units 10 in the system 56 are configured to communicate with each other, the information relating to parameters corresponding to one charger unit or a battery associated therewith may be used by other charger units in addition to, or instead of, information obtained by those charger units in the charging control process for the batteries associated therewith. Therefore, the system 56 provides a way to implement a coordinated charging system for a plurality of battery charger units 10 coupled to a common power source 16 wherein each charger unit 10 is itself configured to control the charging of the respective battery associated therewith. As illustrated in FIG. 7, such a system allows for the staggered and/or coordinated charging of the batteries associated with the charger units 10 that are part of the system 56 so as to optimize both the charging of the batteries and the demands on the power source 16.

In an exemplary embodiment, each charger unit 10 coupled to the network 58 may be configured to maintain a table or database that contains information relating to the other charger units 10, or the operation thereof, and/or the batteries 12 associated therewith. As illustrated in FIG. 8, the memory 20 of the monitoring unit 14 of each charger unit 10 may be configured to maintain a database, such as the database 50, for each charger unit 10. The database may be a single table that contains information for all of the battery charger units 10 in the system 56, including the battery charger unit 10 on which the database 50 is stored, or, as illustrated in FIG. 8, may comprise separate tables for each charger unit 10. The database 50 may contain a listing of all of the parameters that may be evaluated or used, such as those described or identified above, as well as others, such as, for example, the number of batteries currently coupled to the network 58 and being charged or requiring charging, and also contain the scaled/correlated values that correspond to those parameters. The database 50, and more specifically the information therein, may be used by the processor 18 of the charger unit 10 in the control of the battery 12 associated therewith in, for example, the manner described above. Accordingly, the processor 18 is configured to access the database 50 to acquire the information corresponding to the relevant parameters being used, and to acquire the control values corresponding thereto or indicative thereof to carry out the charging control process.

It should be understood that the charger unit 10, and particularly the monitoring unit 14 (or processor 18 thereof), as described above may include conventional processing apparatus known in the art, capable of executing pre-programmed instructions stored in an associated memory, all performing in accordance with the functionality described herein. It is contemplated that the methods described herein, including without limitation the method steps of embodiments of the invention, will be programmed in a preferred embodiment, with the resulting software being stored in an associated memory and where so described, may also constitute the means for performing such methods. Implementation of the invention, in software, in view of the foregoing enabling description, would require no more than routine application of programming skills by one of ordinary skill in the art. Such a system may further be of the type having both ROM, RAM, a combination of non-volatile and volatile (modifiable) memory so that the software can be stored and yet allow storage and processing of dynamically produced data and/or signals.

Although only certain embodiments have been described above with a certain degree of particularity, those skilled in the art could make numerous alterations to the disclosed embodiments without departing from the scope of this disclosure. Joinder references (e.g., attached, coupled, connected, and the like) are to be construed broadly and may include intermediate members between a connection of elements and relative movement between elements. As such, joinder references do not necessarily infer that two elements are directly connected/coupled and in fixed relation to each other. Additionally, the terms electrically connected/coupled and in communication are meant to be construed broadly to encompass both wired and wireless connections and communications. It is intended that all matter contained in the above description or shown in the accompanying drawings shall be interpreted as illustrative only and not limiting. Changes in detail or structure may be made without departing from the invention as defined in the appended claims.

What is claimed is:

1. An apparatus for charging a battery, comprising:
   a monitoring unit configured to be electrically coupled to said battery and a power source, wherein said monitoring unit is configured to:
      acquire a control value indicative of a predetermined parameter, said parameter including a random number;
      calculate a charging current, said charging current being determined as a function of at least said control value indicative of said predetermined parameter including said random number, and
      control the charging of said battery responsive to said control value, wherein said charging of said battery includes charging said battery according to said charging current.

2. The apparatus of claim 1, wherein said monitoring unit is configured to determine when to charge said battery based on said control value, and to control the charging of said battery in accordance with said determination.

3. The apparatus of claim 1, wherein said charging current is determined at least in part by a normalizing value.

4. The apparatus of claim 1, wherein said battery is a first battery and said monitoring unit is a first monitoring unit, said apparatus further comprising a receiver electrically coupled to said monitoring unit and operative to receive electrical signals generated by a second monitoring unit associated with a second battery, wherein said electrical signals are representative of information relating to at least one of said second battery and the charging of said second battery.

5. The apparatus of claim 4, wherein said information represented by said electrical signals comprises a second control value, said second control value indicative of a second parameter, said second parameter relating to at least one of said second battery and the charging of said second battery, and further wherein said first monitoring unit is configured to control the charging of said first battery responsive to said second control value.

6. The apparatus of claim 4, wherein said first monitoring unit is configured to acquire a second control value from said information represented by said electrical signals, wherein said second control value is indicative of a parameter relating to at least one of said second battery and the charging of said second battery.

7. The apparatus of claim 4, wherein said monitoring unit and said second monitoring unit are coupled together via a peer-to-peer network, and said first monitoring unit is configured to receive electrical signals directly from said second monitoring unit via said peer-to-peer network.

8. The apparatus of claim 3, wherein said normalizing value corresponds to user-defined charging window.

9. The apparatus of claim 1, further comprising a transmitter electrically coupled with said monitoring unit and operative to transmit electrical signals generated by said monitoring unit, wherein said electrical signals are representative of information relating to at least one of said battery and the charging of said battery.

10. The apparatus of claim 1, wherein said monitoring unit is configured to acquire a second predetermined parameter, said second predetermined parameter comprising a remaining charge level of said battery, and further wherein said monitoring unit is configured to sense said remaining charge level of said battery.

11. The apparatus of claim 10, wherein said monitoring unit further comprises a battery level sensor configured to be electrically coupled to said battery and operative to sense said remaining charge level of said battery.

12. The apparatus of claim 1, wherein said monitoring unit is configured to acquire a second predetermined parameter, said second predetermined parameter comprising a voltage level of said power source, and further wherein said monitoring unit is configured to sense said voltage level of said power source.

13. The apparatus of claim 1, wherein said monitoring unit comprises a processor configured to acquire said control value indicative of said predetermined parameter and to control the charging of said battery.

14. The apparatus of claim 1 further comprising a current regulator configured to be electrically coupled to said monitoring unit, said power source, and said battery, said current regulator operative to regulate the charging current supplied to said battery.

15. The apparatus of claim 1 further comprising a user input device electrically coupled to said monitoring unit.

16. The apparatus of claim 1 further comprising a display device electrically coupled to said monitoring unit.

17. A battery charging system, comprising
   a first battery charger unit configured to be electrically coupled to a first battery and a power source;
   a second battery charger unit configured to be electrically coupled to a second battery and said power source;
   each of said first and second battery charger units configured to obtain information relating to at least one of said first and second batteries, respectively, the charging of said first and second batteries, respectively, and said power source;
   each of said first and second battery charger units configured to communicate said obtained information to the other of said first and second battery charger units; and wherein
   said first battery charger unit is configured to:
      acquire a first control value indicative of a predetermined parameter, said predetermined parameter including a random number;
      calculate a charging current, said charging current being determined as a function of at least said first control value indicative of said predetermined parameter including said random number, and control the charging of said first battery responsive to said control value acquired by said first battery charger unit, wherein said charging of said battery includes charging said battery according to said charging current; and said second battery charger unit is configured to:
acquire a second control value indicative of a predetermined parameter based on at least one of said information obtained by said second battery charger unit, and said information obtained by said first battery charger unit and received by said second battery charger unit, and control the charging of said second battery responsive to said second control value acquired by said second battery charger unit.

18. The system of claim 17 further comprising a communication network to which said first and second battery charger units are coupled and over which said first and second battery charger units are configured to communicate.

19. The system of claim 18 wherein said network is a peer-to-peer network.

20. A method of charging a battery, comprising:
providing a battery charger unit comprising a monitoring unit electrically coupled to said battery and a power source;
acquiring, by said monitoring unit, a control value indicative of a predetermined parameter, said predetermined parameter including a random number;
calculating a charging current, said charging current being determined as a function of at least said control value indicative of said predetermined parameter including said random number, and
controlling, by said monitoring unit, the charging of said battery responsive to said control value, wherein said charging of said battery includes charging said battery according to said charging current.

21. The method of claim 20 further comprising the step of determining when to charge said battery responsive to said control value, and wherein said controlling step comprises controlling the charging of said battery in accordance with said determination.

22. The method of claim 20, including communicating with another battery charger unit via a peer-to-peer network.

23. The method of claim 20, wherein said battery is a first battery, said battery charger unit is a first battery charger unit, and said monitoring unit is a first monitoring unit, said method further comprising the step of receiving, by said first monitoring unit, electrical signals generated by a second monitoring unit of a second battery charger unit associated with a second battery, wherein said electrical signals are representative of information relating to at least one of said second battery and the charging of said second battery.

24. The method of claim 23, wherein said information represented by said electrical signals comprises a second control value, said second control value indicative of a second parameter, said second parameter relating to at least one of said second battery and the charging of said second battery, and said controlling step comprises controlling the charging of said first battery responsive to said second control value.

25. The apparatus of claim 23, wherein said information represented by said electrical signals comprises information used by said first monitoring unit to acquire said control value, and further wherein said acquiring step comprises acquiring, by said first monitoring unit, said control value based on said information received directly from said second monitoring unit, wherein said control value is indicative of a parameter relating to at least one of said second battery and the charging of said second battery.

26. The method of claim 23 further comprising the steps:
generating, by said first monitoring unit, a request to said second monitoring unit for said information relating to at least one of said second battery and the charging of said second battery; and
transmitting said request to said second monitoring unit.

27. The method of claim 20, wherein said charging current corresponds to a weight, said weight corresponding to user input.

28. The method of claim 20, wherein said predetermined parameter comprises at least one of a charge level of said battery and a voltage level of said power source, said method further comprising the step of sensing at least one of said charge level of said battery and said voltage level of said power source.

* * * * *